(12) United States Patent
Lin et al.

(10) Patent No.: US 9,379,752 B2
(45) Date of Patent: Jun. 28, 2016

(54) COMPENSATION SCHEME FOR MHL COMMON MODE CLOCK SWING

(71) Applicant: Lattice Semiconductor Corporation, Portland, OR (US)

(72) Inventors: Xiaozhi Lin, Shanghai (CN); Fei Song, Shanghai (CN); Gyudong Kim, San Jose, CA (US); Chwei-po Chew, Cupertino, CA (US); Min-Kyu Kim, Sunnyvale, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 171 days.

(21) Appl. No.: 14/118,832

(22) PCT Filed: Dec. 28, 2012

(86) PCT No.: PCT/CN2012/087809
§ 371 (c)(1),
(2) Date: Nov. 19, 2013

(87) PCT Pub. No.: WO2014/101088
PCT Pub. Date: Jul. 3, 2014

(65) Prior Publication Data
US 2015/0288397 A1    Oct. 8, 2015

(51) Int. Cl.
*H04L 25/00* (2006.01)
*H04B 1/12* (2006.01)
*H03F 3/45* (2006.01)
*H04L 27/26* (2006.01)

(52) U.S. Cl.
CPC ............ *H04B 1/123* (2013.01); *H03F 3/45475* (2013.01); *H03F 3/45717* (2013.01); *H04L 27/2691* (2013.01); *H03F 2203/45418* (2013.01)

(58) Field of Classification Search
CPC  H04B 1/123; H04L 27/2691; H04L 25/0272; H04L 25/00292
USPC ........... 375/257, 219, 316; 330/253, 257, 260
See application file for complete search history.

(56) References Cited

U.S. PATENT DOCUMENTS

| | | | |
|---|---|---|---|
| 6,292,031 B1 | 9/2001 | Thompson et al. | |
| 2003/0193372 A1* | 10/2003 | Huang | H03B 5/1243 331/100 |
| 2009/0058525 A1* | 3/2009 | Damitio | H03F 3/45085 330/257 |
| 2010/0104029 A1 | 4/2010 | Lee et al. | |
| 2012/0003863 A1 | 1/2012 | Sung et al. | |
| 2012/0005377 A1* | 1/2012 | Kim | G06F 13/4072 710/16 |

FOREIGN PATENT DOCUMENTS

CN    1334987    2/2002
WO    WO-2012/003328    1/2012

OTHER PUBLICATIONS

International Search Report and Written Opinion of the International Searching Authority (China) dated Oct. 10, 2013, in International Patent Application No. PCT/CN2012/087809, 10 pages.

* cited by examiner

*Primary Examiner* — Khai Tran
(74) *Attorney, Agent, or Firm* — Fenwick & West LLP

(57) ABSTRACT

Embodiments of the invention are generally directed to compensation for common mode signal swing. An embodiment of an apparatus includes a connector for the transfer of the data, the connector including connections for a first set of one or more conductors; a receiver for the reception of data via the connector, the received data including a first signal and a second signal transmitted via the set of one or more conductors, the second signal being a common mode signal modulating the first signal, the receiver including an amplifier to amplify the received data with a positive gain; and a common mode compensation circuit to compensate for a voltage swing of the common mode signal in the amplified received data. The common mode compensation circuit is to sense the common mode signal, amplify the sensed common mode signal with a negative gain, and feed back the amplified common mode to output nodes of the receiver.

14 Claims, 13 Drawing Sheets

COMPENSATION SCHEME FOR MHL COMMON MODE CLOCK SWING

TECHNICAL FIELD

Embodiments of the invention generally relate to the field of data communications, and, more particularly, to compensation for common mode signal swing.

BACKGROUND

In the transfer of data, including audio-video data, between electronic devices, there are several different types of data that may be transferred. The data may include content data control data, clock signals, and other data signals transmitted from a first source device to a second sink device.

Mobile electronic devices are increasingly storing and transferring complex data, such as high definition video. The smaller form factor of mobile devices requires smaller connectors, which may be addressed by utilizing connectors and cables with fewer conductors. Because of the smaller number of conductors, in some instances multiple signals may be transmitted over a set of on or more conductors, such as, for example, a single pair of conductors.

For example, the MHL (Mobile High-Definition Link) protocol utilizes a conductor pair for transmission of a differential data signal and for the transmission of a common mode clock signal, where the differential signal data stream is modulated by the common mode signal.

However, the transmission of multiple different signals over a set of one or more conductors can cause certain complications. In particular, the voltage swing, or difference between voltage levels for a common mode signal, can create difficulties for a sink device if the voltage swing is excessively large,

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Figure 1:
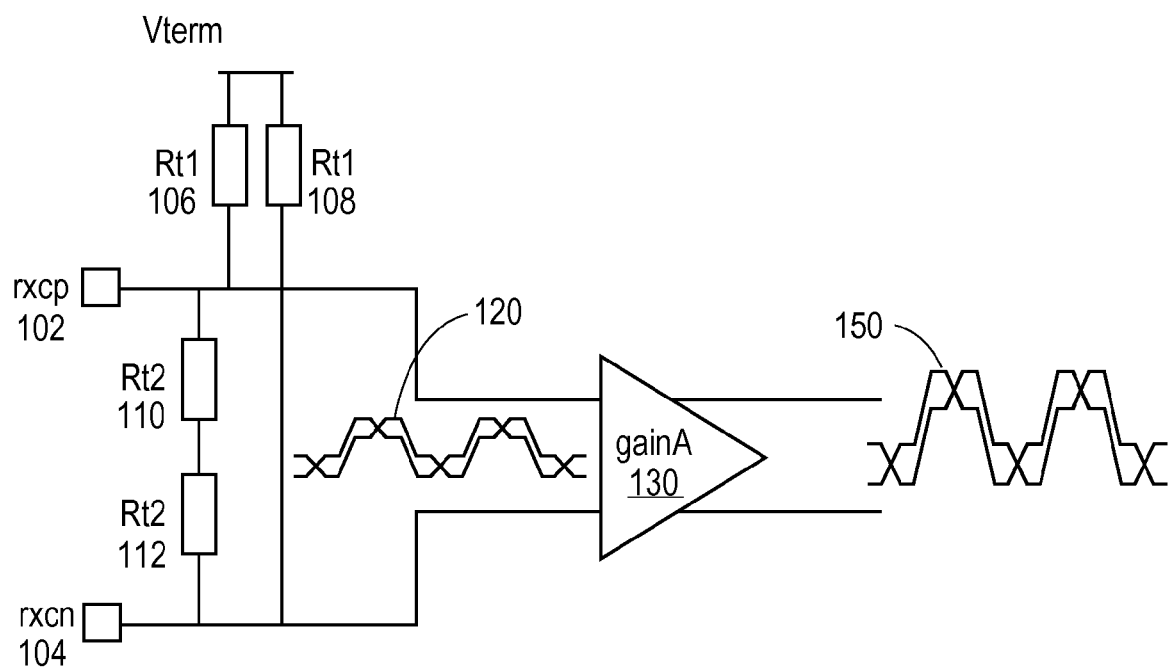
FIG. 1 is an illustration of an apparatus or system utilizing differential and common mode signaling.

Embodiments of the invention are generally directed to compensation for common mode signal swing.

In a first aspect of the invention, an embodiment of an apparatus includes a connector for the transfer of the data, the connector including connections for a first set of one or more conductors; a receiver for the reception of data via the connector, the received data including a first signal and a second signal transmitted via the set of one or more conductors, the second signal being a common mode signal modulating the first signal, the receiver including an amplifier to amplify the received data with a positive gain; and a common mode compensation circuit to compensate for a voltage swing of the common mode signal in the amplified received data. The common mode compensation circuit is to sense the common mode signal, amplify the sensed common mode signal with a negative gain, and feed back the amplified common mode to output nodes of the receiver.

DETAILED DESCRIPTION

Embodiments of the invention are generally directed to compensation for common mode signal swing.

As used herein:

"Mobile device" means a telephone (such as a smartphone), laptop computer, handheld computer, tablet computer, mobile Internet device (MID), or other mobile electronic device.

In the transmission and reception of data, an apparatus or system may be implemented in a manner to provide for transmitting multiple signals over a communication channel or channels in order to increase the number of transmissions without requiring additional channels.

For example, an apparatus or system may include the transmission of a common mode signal, a first data transmission, over a pair of conductors that are utilized for a different second data transmission, where the second data transmission may include a differential signal transmission.

For example, the MHL system may include a transmission over an MHL cable, where the clock signal may be provided as a common mode signal over the differential signal data signal provided over two data lines.

However, there are complications in the transmission of a first data transmission over a second data transmission. If a common mode swing is too great, this can affect receiver performance. In particular, the amplification of signals may create an excessively large voltage swing. In an example, for an MHL application, the common mode clock is added to the differential data. At the sink side, the large common mode signal swing creates problems for a receiver circuit, where large gain variation and related issue will reduce the sink performance.

In particular, a high common mode signal swing may cause problems in a submicron process. In some embodiments, an MHL common mode compensation circuit is used to reduce the common mode swing.

In some embodiments, an apparatus, system, or method provides for common mode signal compensation. In some embodiments, common mode signal compensation includes the sensing of a common mode signal, the amplification of the signal with a negative signal gain, and the feedback of the amplified signal to counter the amplification of the voltage swing.

FIG. 1 is an illustration of an apparatus or system utilizing differential and common mode signaling. In this illustration, an apparatus or system 100 includes terminals rxcp (which may be referred to as a positive receiver terminal node) 102 and rxcn (a negative receiver terminal node) 104, the nodes being linked by resistors Rt2 110 and 112, with terminal rxcp 102 coupled with a first end of a resistor Rt1 106 and terminal rxcn 104 coupled with a first end of a resistor Rt1 108, a second end of resistor 106 and a second end of resistor 108 being coupled with a voltage Vterm (a terminal voltage). A signal 120 received at the terminals may be combination of signals, including, for example, at least a first differential signal and a common mode signal transmitted on top of the differential signal.

The apparatus or system 100 includes an amplifier element 130, shown as having a gain of A and producing an output signal 150. Due to the common mode signal that modulates the differential signal, as shown in FIG. 1, it is difficult for a conventional system to reduce the common mode swing without attenuating the differential signal or inducing large gain variation.

Figure 2:
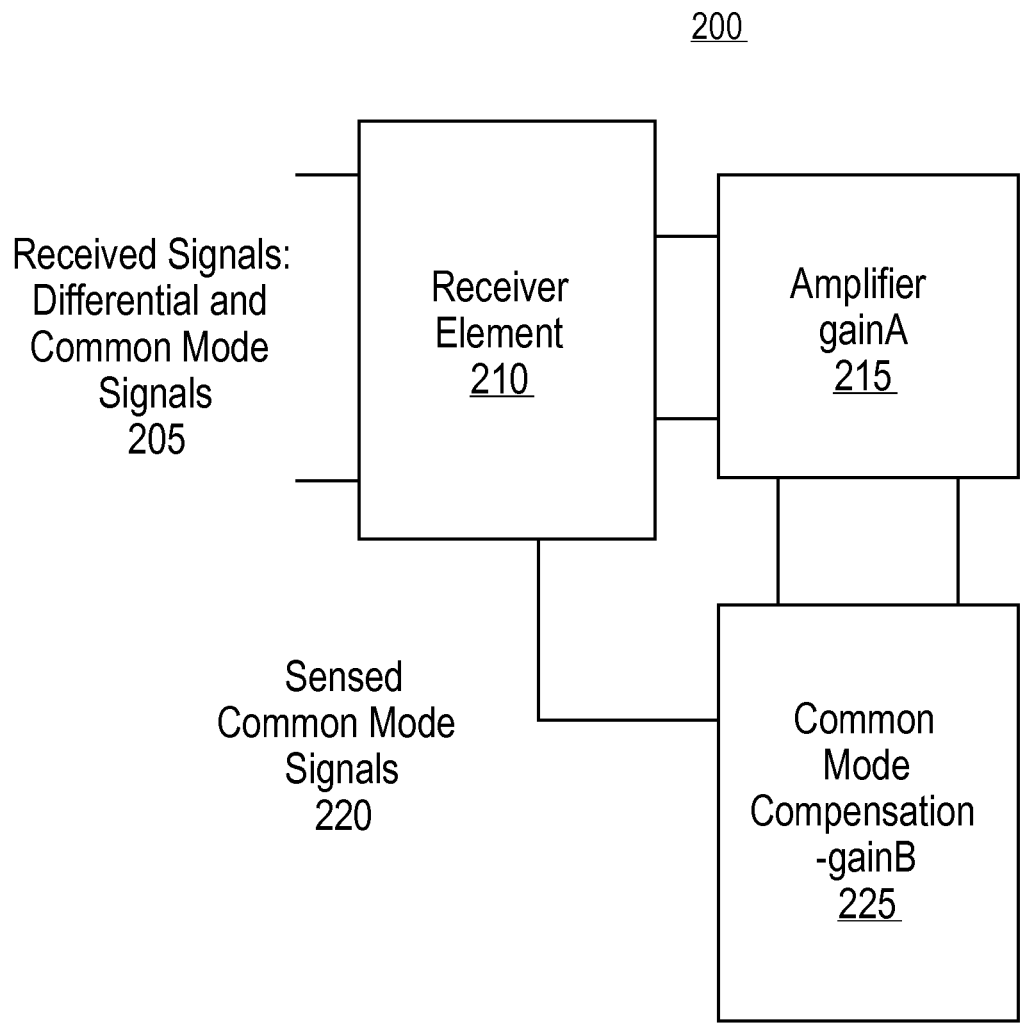
FIG. 2 is a block diagram to illustrate an embodiment of a common mode compensation apparatus or system.

FIG. 2 is a block diagram to illustrate an embodiment of a common mode compensation apparatus or system. In some embodiments, a receiver element 210 of a sink apparatus or system 200 receives a signal stream, where the signal stream is composed of a differential signal that is modulated with a common mode signal 205, such that the common mode signal is transmitted on top of the differential signal. In one example, the differential signal is a data signal and the common mode signal is a clock signal, but embodiments are not limited to these particular signals.

In some embodiments, the receiver element provides the received signals to an amplifier element 215, illustrated with a positive gain of gainA for the combined signals. However, the amplification of the combined received signals will increase the voltage swing of the differential signal. In some embodiments, sensed common mode signals 220 of the received signals 205 are provided to a common mode compensation circuit or element 225, where the common mode compensation circuit 225 may include a negative gain (−gainB) to provide a negative feedback to the amplified combined signals. In some embodiments, the negative feedback is utilized to reduce the common mode voltage swing by maintaining the amplified gain of the differential signals.

Figure 3:
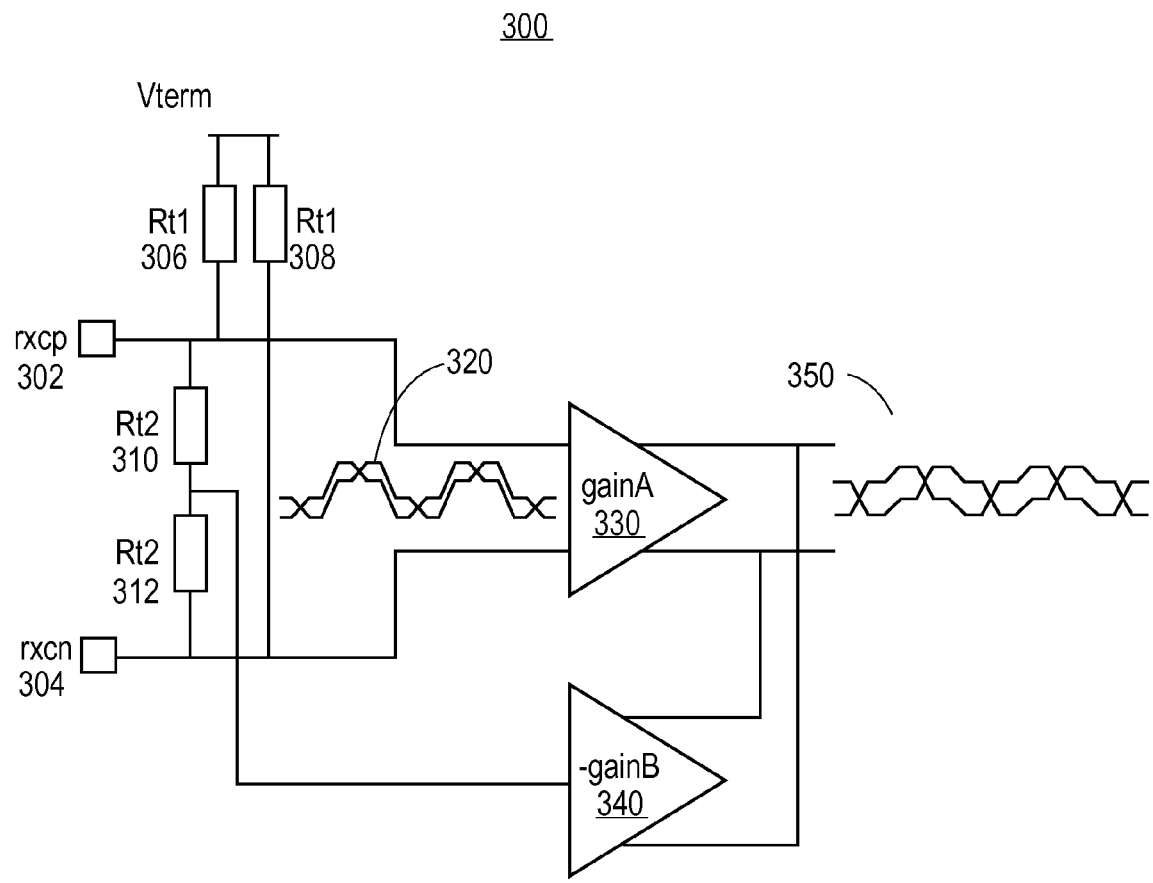
FIG. 3 illustrates an embodiment of an apparatus to reduce common mode voltage swing.

FIG. 3 illustrates an embodiment of an apparatus to reduce common mode voltage swing. In some embodiments, an apparatus, system, and method are provided to reduce a common mode swing while reducing or eliminating the loss for an underlying differential signal. In FIG. 3, an apparatus or system 300 includes terminals rxcp 302 and rxcn 304, the nodes being linked by resistors Rt2 310 and 312, with terminal rxcp 302 coupled with a first end of a resistor Rt1 306 and terminal rxcn 304 coupled with a first end of a resistor Rt1 308, where a second end of each of resistors 306 and 308 is coupled with Vterm.

In this illustration, the apparatus or system 300 includes a first amplifier element 330, shown as having a game of gainA, coupled with rxcp and rxcn. In some embodiments, the apparatus 300 further includes a second amplifier element 340 with a negative gain of −gainB, the second amplifier element 340 having an input at a node between resistor 310 and resistor 312 for sensing of the common signal and an output at output nodes of the first amplifier 330.

In some embodiments, the second amplifier element 340 senses the input common mode signal, and operates to amplify this signal with a reverse gain (−gainB) such that the total gain of common mode signal will be gainA−gainB. However, because the second amplifier element is amplifying the sensed common mode signal, the differential gain for the apparatus or system will remain unchanged at gainA.

Figure 4:
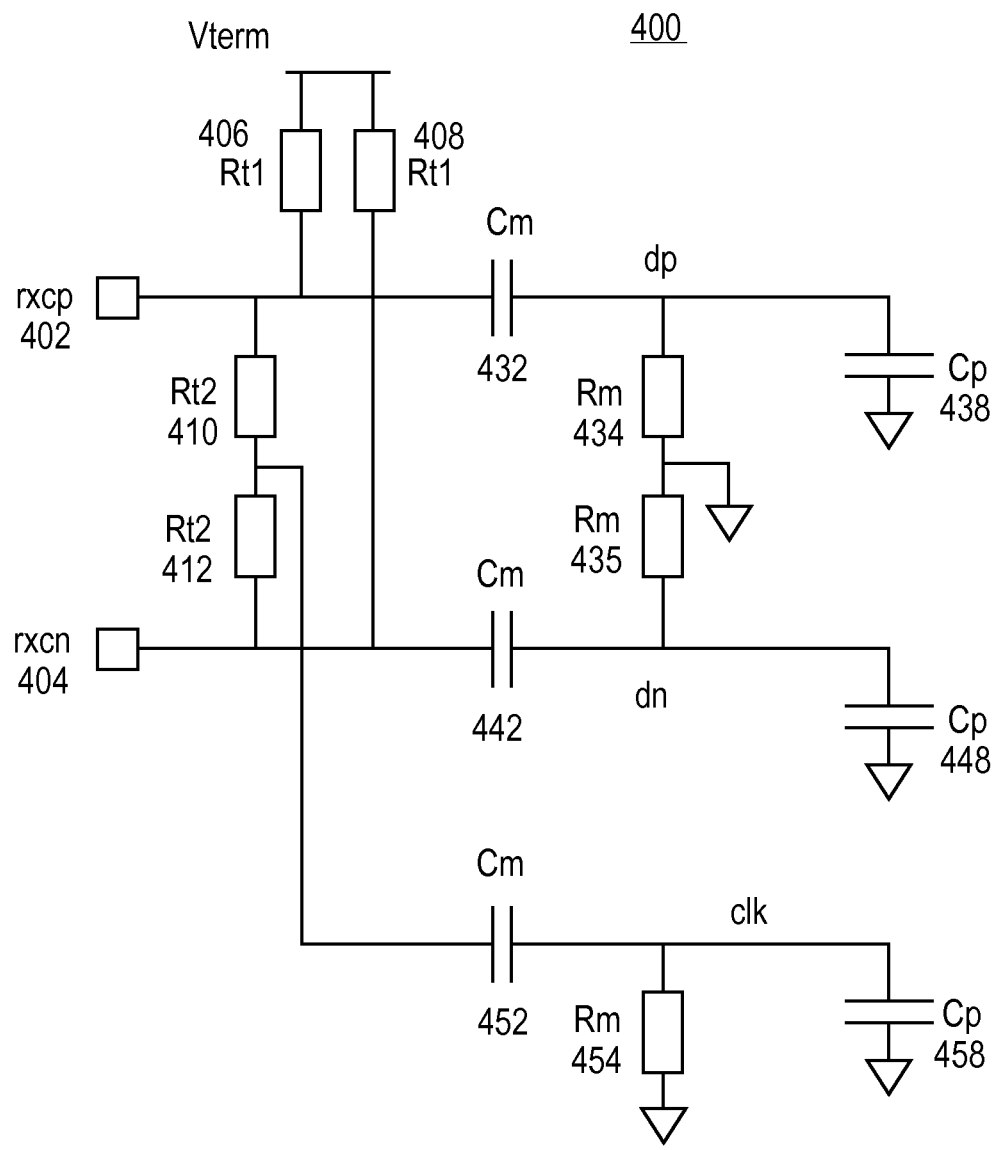
FIG. 4 illustrates an MHL sink apparatus or system.

FIG. 4 illustrates an MHL sink apparatus or system. In this illustration, an MHL apparatus or system 400 includes terminal nodes rxcp 402 and rxcn 404, the terminals being linked by resistors Rt2 410 and 412, with terminal rxcp 402 being coupled with a first end of a resistor Rt1 406 and terminal rxcn 404 coupled with a first end of a resistor Rt1 408, where a second end of resistor 406 and a second end of resistor 408 are coupled with Vterm.

The apparatus or system 400 further includes a first coupling capacitor Cm 432 with a first end coupled with rxcp 402 and a second end coupled with a positive node DP; a second coupling capacitor Cm 442 with a first end coupled with rxcn 404 and a second end coupled with a negative node DN; and a third coupling capacitor Cm 452 with a first end coupled with a common mode node between resistor 410 and resistor 412, and a second end coupled with a clock node CLK. The apparatus or system 400 includes resistors Rm 434 and 435 between node DP and node DN, a node between resistor 434 and 435 being coupled to ground as a common mode ground. Node DP is further coupled with a first end of a capacitor Cp 438, a second end of capacitor 438 being coupled with ground. Node NP is further coupled with a first end of a Cp capacitor 448, a second end of capacitor 448 being coupled with ground. Node CLK is further coupled with a first end of a capacitor Cp 458 and a first end of a resistor Rm 454, a second end of capacitor 458 being coupled with ground.

In the MHL apparatus or system, differential data signals are produced at nodes DP and DN, with a common mode clock signal being produced at node CLK. As shown in FIG. 2, the amplification of signals may result in an excessively large common mode voltage swing.

In some embodiments, a circuit is added to the apparatus or system to provide a feedback to compensate for the voltage swing of the common mode signal.

Figure 5:
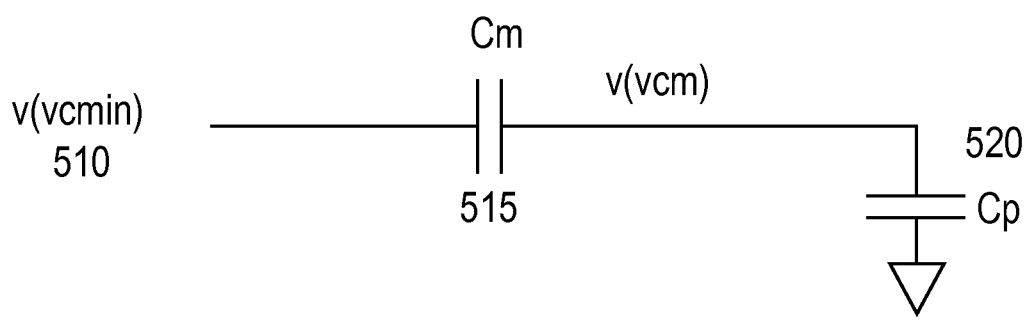
FIG. 5 is an illustration of a simplified common mode signal flow diagram for an embodiment of an apparatus or system.
Figure 5:
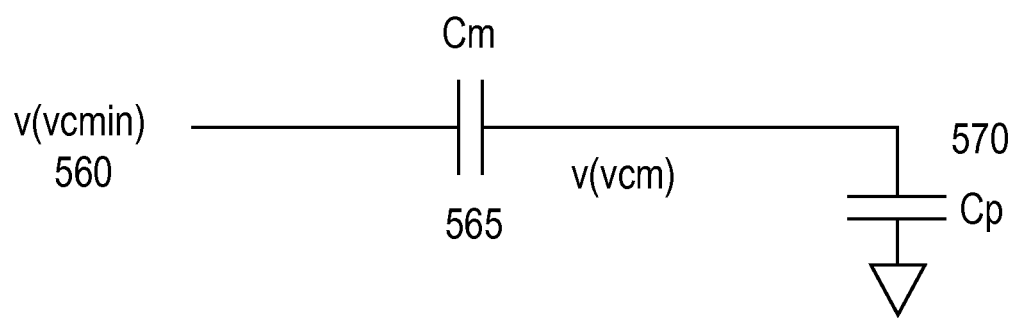

FIG. 5 is an illustration of a simplified common mode signal flow diagram for an embodiment of an apparatus or system. In this illustration, a first branch 505 includes node v(vcmin) 510 coupled with capacitor Cm 515, which is linked in series with capacitor Cp 520; and a second branch 555 includes node v(vcmin) 560 coupled with capacitor Cm 565, which is linked in series with capacitor Cp 570. In this illustration, a low frequency pole of the common mode signal flow diagram 500 caused by resistor Rm (resistor 454 in FIG. 4) is ignored in order to simplify the analysis. In simplified form, a transfer function for the common mode signal is provided in Equation 1:

$$V(vcm) = V(vcmin) \times \frac{Cm}{(Cm + Cp)} \quad [\text{Eq. 1}]$$

Figure 6:
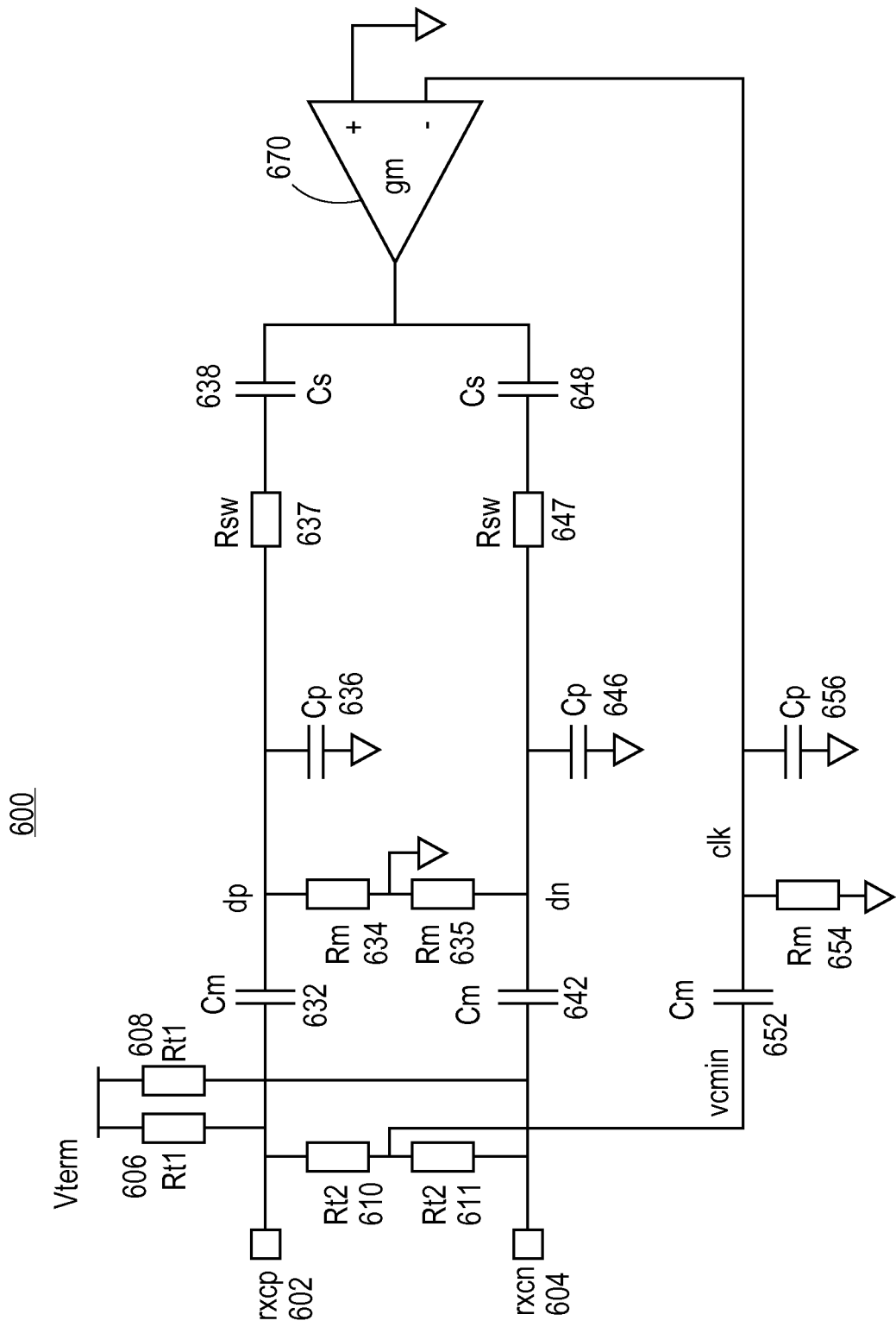
FIG. 6 is an illustration of an embodiment of an MHL common mode compensation apparatus or system with AC coupling.

Where
VCM—common mode voltage
vcmin=minimum common mode voltage value
Cm=capacitance of capacitor Cm
Cp=capacitance of capacitor Cp FIG. 6 is an illustration of an embodiment of an MHL common mode compensation apparatus or system. In some embodiments, an MHL apparatus or system 600 includes terminals rxcp 602 and rxcn 604, the terminals being linked by resistors Rt2 610 and 612, with rxcp 602 coupled with a first end of a resistor Rt1 606 and rxcn 604 coupled with a first end of a resistor Rt1 608, where a second end of resistor 606 and a second end of resistor 608 are coupled with Vterm.

The MHL apparatus or system 600 further includes a first coupling capacitor Cm 632 with a first end coupled with rxcp 602 and a second end coupled with a positive node DP; a second coupling capacitor Cm 642 with a first end coupled with rxcn 604 and a second end coupled with a negative node DN; and a third coupling capacitor Cm 652 with a first end coupled with a common mode node between resistor 610 and resistor 612, and a second end coupled with a clock node CLK. The apparatus or system 600 includes resistors Rm 634 and 635 between node DP and node DN, a node between resistor 634 and 635 being coupled to ground as a common mode ground. Node DP is further coupled with a first end of a capacitor Cp 636, a second end of capacitor 636 being coupled with ground. Node DN is further coupled with a first end of a Cp capacitor 646, a second end of capacitor 646 being coupled with ground. Node CLK is further coupled with a first end of a capacitor Cp 656 and a first end of a resistor Rm 654, a second end of capacitor 656 and a second end of resistor 654 being coupled with ground.

In some embodiments, the CLK node is coupled with a first input of an amplifier 670, a second input of amplifier 670 being coupled with ground. The MHL apparatus or system 600 in this figure utilizes AC coupling, where, in some embodiments, an output of the amplifier 670 is fed back to the differential portion of the circuit, the output being further coupled with a first end of capacitor Cs 638 and a first end of capacitor Cs 648. A second end of capacitor 638 is coupled with a first end of resistor Rsw 637, a second end of resistor 637 being coupled with node DP; and a second end of capacitor 648 is coupled with a first end of resistor Rsw 647, a second end of resistor 647 being coupled with node DN.

In some embodiments, apparatus or system 600 utilizes a reverse AC current to reduce the charge in the DP and DN nodes, which operates to reduce the common mode voltage at DP and DN nodes. In some embodiments, the reduction in the common voltages at the DP and DN operates to reduce the effective common mode voltage swing.

Figure 11:
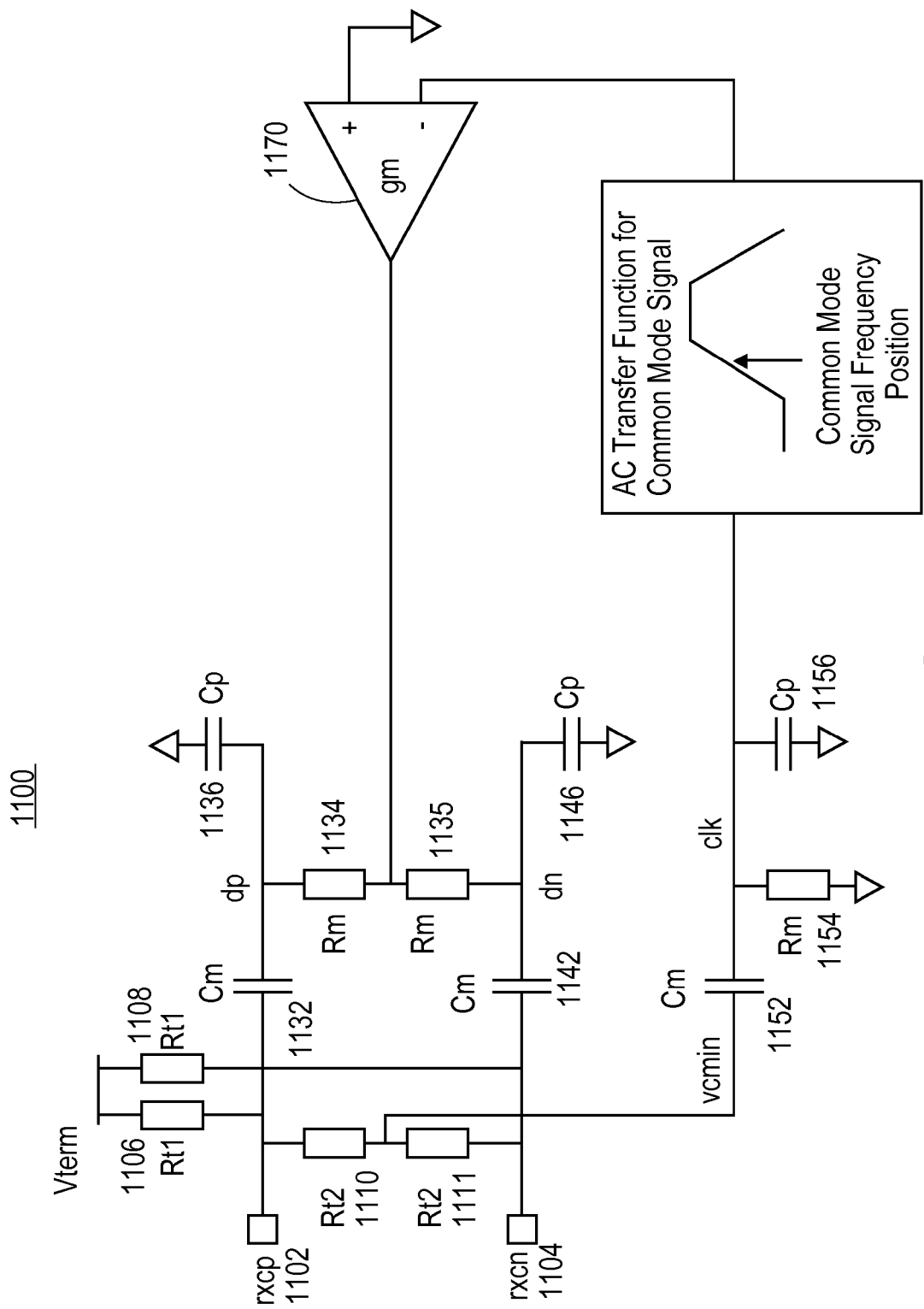
FIG. 11 is a is an illustration of an embodiment of a common mode compensation apparatus or system.

While FIG. 6 illustrates AC-coupling via coupling capacitors, embodiments are not limited to AC-coupled circuits. In some embodiments, common mode compensation may be provided in a DC (direct current) coupled circuit implementation, such as illustrated in FIG. 11, described below.

Figure 7:
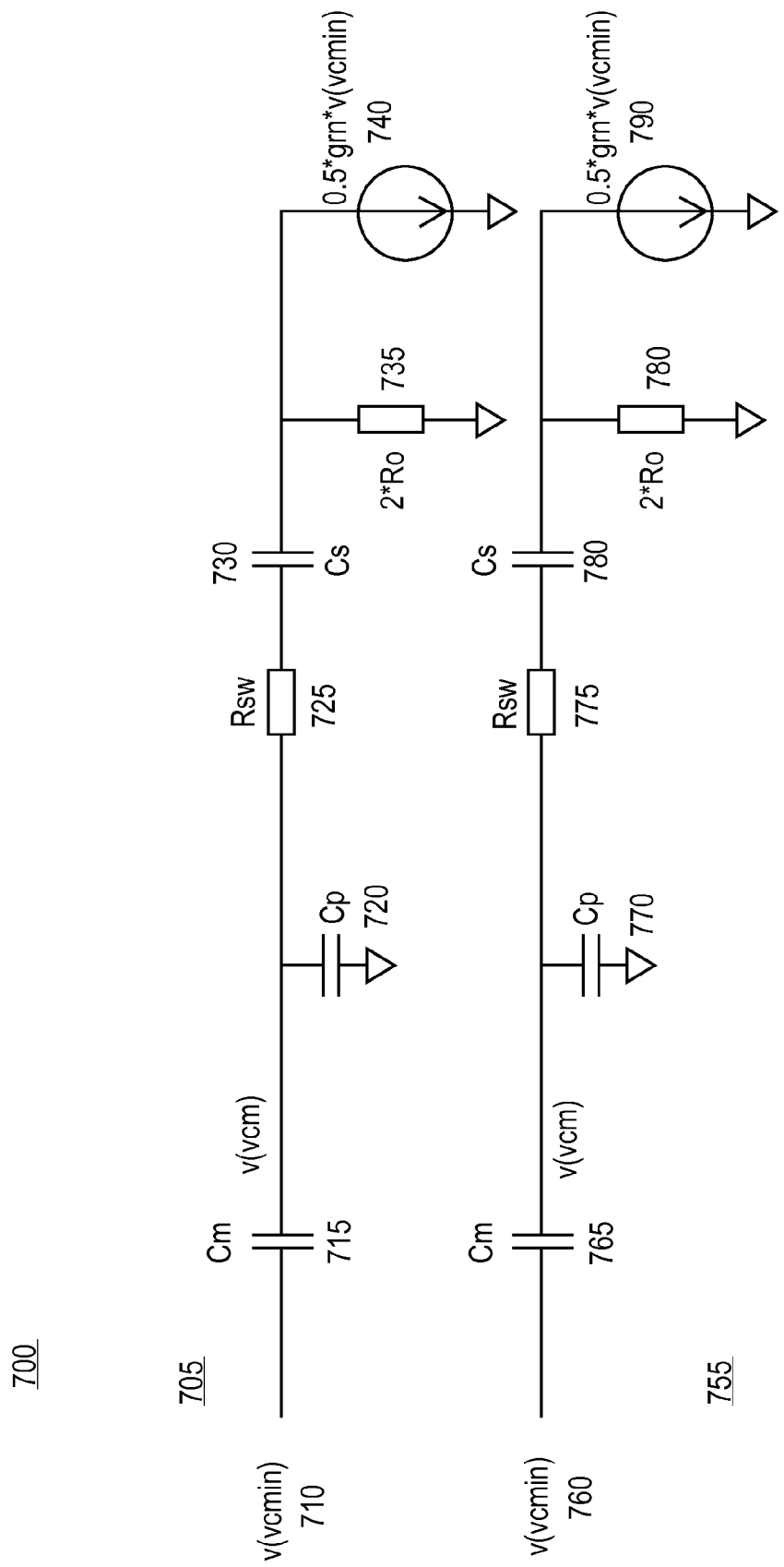
FIG. 7 is an illustration of an embodiment of a simplified MHL apparatus or system for analysis.

FIG. 7 is an illustration of an embodiment of a simplified MHL apparatus or system for analysis. In this illustration, a simplified version of an apparatus or system 700 includes a first branch 705 for the DP node and a second branch 755 for the DN node. In this illustration, the first branch 705 includes a terminal receiving v(vcmin) 710 coupled with a first end of capacitor Cm 715, a second end of capacitor 715 being coupled with a first end of capacitor Cp 720 and a first end of resistor Rsw 725. A second end of capacitor 720 is coupled with ground and a second end of resistor 725 is coupled with a first end of capacitor Cs 730. A second end of capacitor 730 is coupled with a first end of a resistor 2*Ro 735 and a first end of a current source 0.5*gm*v(vcmin) 740.

Similarly, the second branch 755 includes a terminal receiving v(vcmin) 760 coupled with a first end of capacitor Cm 765, a second end of capacitor 765 being coupled with a first end of capacitor Cp 770 and a first end of resistor Rsw 775. A second end of capacitor 770 is coupled with ground and a second end of resistor 775 is coupled with a first end of capacitor Cs 780. A second end of capacitor 780 being coupled with a first end of a resistor 2*Ro 785 and a first end of a current source 0.5*gm*v(vcmin) 790.

A transfer function for the common mode signal with MHL compensation is provided in Equation 2.

$$V(vcm) = V(vcmin) \times \frac{(Cm - gm \cdot Ro \cdot Cs)}{Cm + Cp + Cs} \times \frac{1 + s \cdot \frac{(2 \cdot Ro + Rsw) \cdot Cm \cdot Cs}{Cm - gm \cdot Ro \cdot Cs}}{1 + s \cdot \frac{(2 \cdot Ro + Rsw) \cdot Cs \cdot (Cm + Cp)}{Cm + Cp + Cs}} \quad [\text{Eq. 2}]$$

In Equation 2, if the zero and pole are assumed to be larger than the common mode clock frequency, then the transfer function for common mode may be further simplified as Equation 3.

$$V(vcm) = V(vcmin) \times \frac{(Cm - gm \cdot Ro \cdot Cs)}{Cm + Cp + Cs} \quad [\text{Eq. 3}]$$

Comparing Equation 1 and Equation 3, the common mode amplitude ratio before and after compensation may be derived as Equation 4.

$$\text{Ratio} = \left(1 - gm \cdot Ro \cdot \frac{Cs}{Cm}\right) \times \frac{Cm + Cp}{Cm + Cp + Cs} \quad [\text{Eq. 4}]$$

In an operation, if the common mode amplitude ratio is less than 1, then the common mode signal amplitude will be reduced. Table 1 illustrates values without a cable in place.

TABLE 1

| (No Cable) | Differential Swing (V) | Common Mode Swing (V) | Intra-Skew Margin (ps) |
|---|---|---|---|
| Without Compensation | 0.84 | 0.72 | 155 |
| With Compensation | 0.84 | 0.72 | 171 |
| Without Compensation | 0.2 | 0.17 | 140 |
| With Compensation | 0.2 | 0.17 | 160 |

Table 2 provides values derived from a BER (Bit Error Ratio) test for a 3-meter cable, which illustrates that the compensation circuit will improve EQ's performance at a higher frequency.

TABLE 2

| (With 3 m Cable) | Differential Swing (V) | Common Mode Swing (V) | Max Frequency for BER Pass |
|---|---|---|---|
| Without Compensation | 0.84 | 0.72 | 2.8 GHz |
| With Compensation | 0.84 | 0.72 | 2.9 GHz |

The chip measurements provided in Table 1 and Table 2 provide an illustration indicating that a common mode compensation circuit tolerates larger input common mode swing, and improves circuit and system performance.

In some embodiments, a compensation circuit is fabricated in a TSMC 55 nm CMOS technology. In the structure, a first gain block at the sink side is an equalizer. In some embodiments, the EQ (equalization) intra-skew margin in MHL mode with regard to 3G data rate may be evaluated to verify the compensation circuit function. For example, as provided in table 1, the compensation circuit improves intra-skew margin by 20 ps (picoseconds), which indicates that the circuit improves eye opening by 0.06 UI (Unit Interval).

Figure 8:
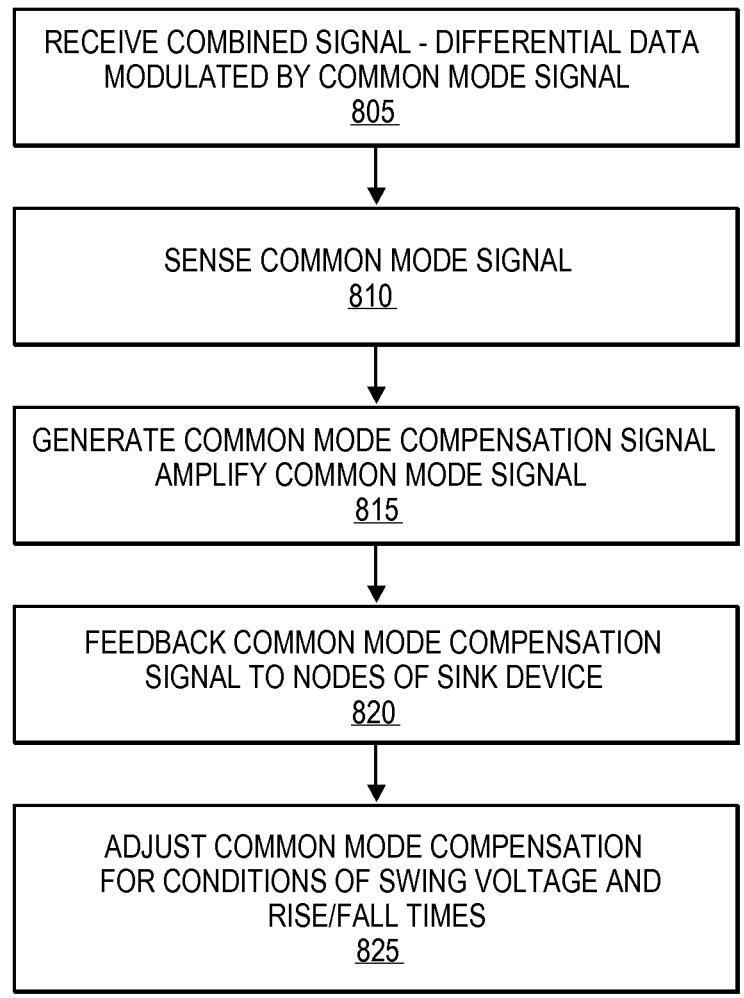
FIG. 8 is a flowchart to illustrate an embodiment of a common mode compensation process.

FIG. 8 is a flowchart to illustrate an embodiment of a common mode compensation process. In some embodiments, a combined signal is received, where the combined signal may be differential data modulated by a common mode signal 805. In some embodiments, the common mode signal is sensed 810, and a common mode compensation signal is generated, which may include amplifying the common signal with a negative gain 815.

In some embodiments, the common mode compensation signal is fed back to the nodes of the sink device 820, thereby applying a reverse AC current to reduce the charge at the DP and DN nodes, operating to reduce the common mode voltage at DP and DN nodes. In some embodiments, the reduction in the common mode voltages at the DP and DN operates to reduce the effective common mode voltage swing.

In some embodiments, the common mode compensation may be adjusted for conditions 825, including use of a DPPL to adjust to the particular common mode swing voltage and rise and fall times of the common mode signal.

Figure 9:
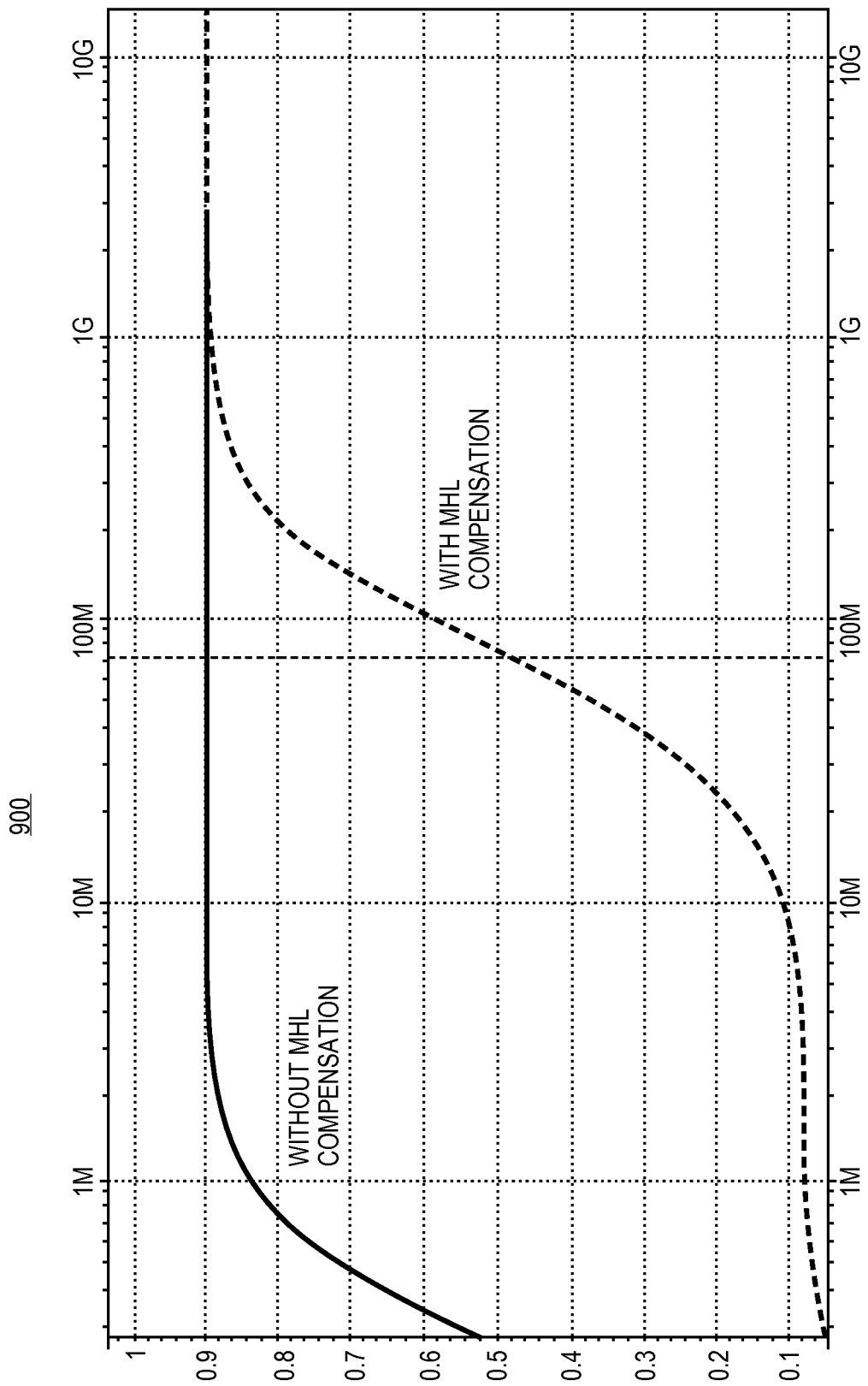
FIG. 9 is a waveform for an embodiment of an apparatus or system utilizing a common mode compensation circuit.

FIG. 9 is a waveform for an embodiment of an apparatus or system utilizing a common mode compensation circuit. FIG. 9 provides an AC transfer function waveform 900. As illustrated in FIG. 9, without MHL compensation, the gain of a common mode signal is approximately 0.9. However, with compensation, the gain is about 0.48, and thus the common mode swing is be reduced by approximately 54%.

For a differential signal, a transfer function from (rxcp, rxcn) to (dp,dn) with MHL compensation is expressed as provided in Equation 5:

$$\frac{Vdp, dn}{Vcp, cn} = \frac{Cm}{Cm + Cp + Cs} \times \frac{(1 + s \cdot Rsw \cdot Cs)}{1 + \frac{s \cdot Rsw \cdot Cs \cdot (Cm + Cp)}{Cm + Cp + Cs}}$$ [Eq. 5]

Comparing Equation 1 and Equation 5, the zero/pole pair will maintain the same gain at high frequency, which is the dominant factor for a high speed system. Further, low frequency loss may be recovered utilizing a circuit such as an equalizer, which is not illustrated. In some embodiments, the MHL compensation circuit thus may be utilized to reduce common mode swing without attenuating a differential signal. In some embodiments, sampling of clock information and feedback to the main signal path is used in the generation of the feedback.

Figure 10:
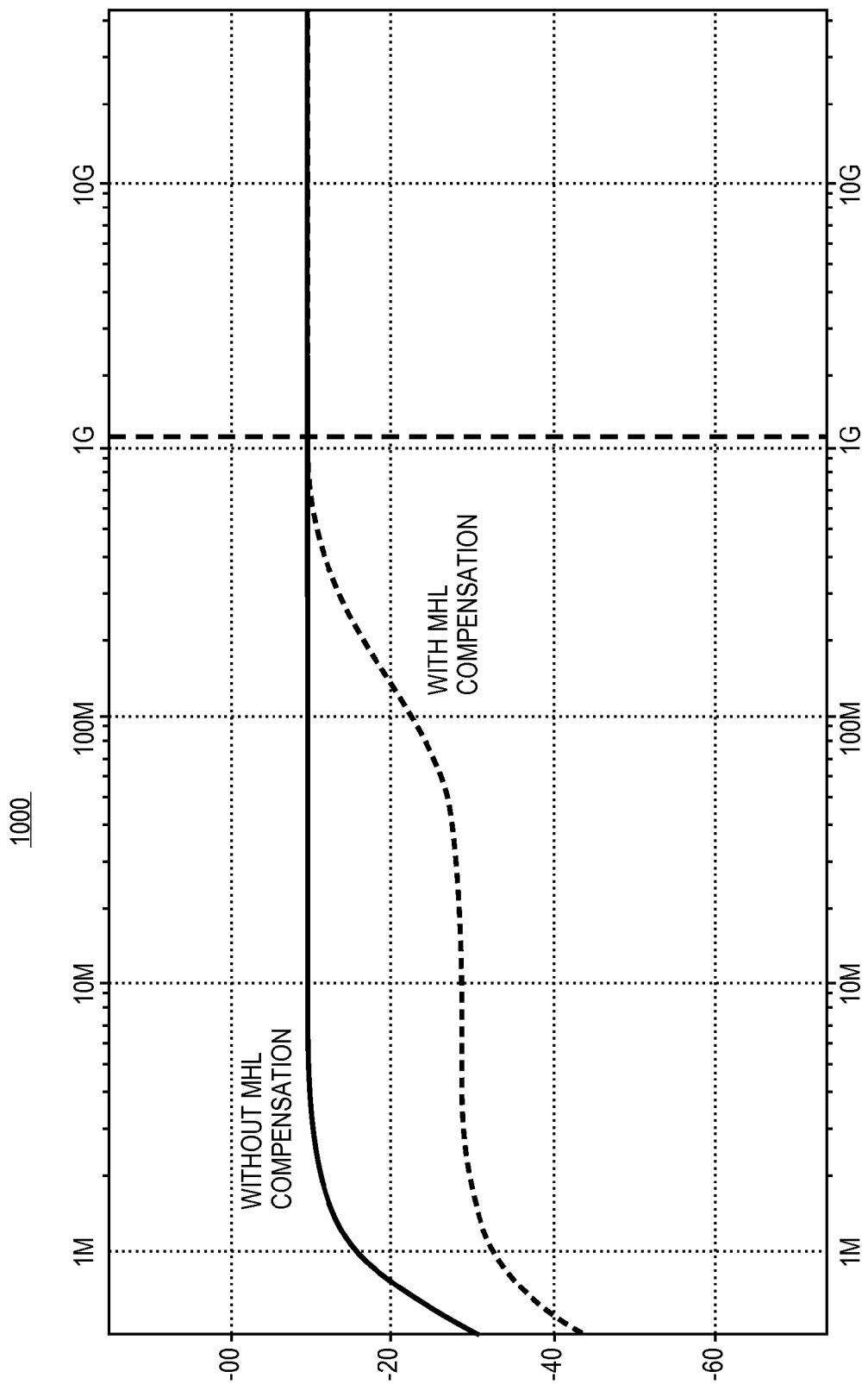
FIG. 10 is a waveform for an embodiment of an apparatus or system utilizing a common mode compensation circuit.

FIG. 10 is a waveform for a differential signal for an embodiment of an apparatus or system utilizing a common mode compensation circuit. FIG. 10 provides an AC transfer function waveform 1000.

FIG. 11 is an illustration of an embodiment of a common mode compensation apparatus or system with DC coupling. In some embodiments, an MHL apparatus or system 1100 includes terminals rxcp 1102 and rxcn 1104, the terminals being linked by resistors Rt2 1110 and 1112, with rxcp 1102 coupled with a first end of a resistor Rt1 1106 and rxcn 1104 coupled with a first end of a resistor Rt1 1108, where a second end of resistor 1106 and a second end of resistor 1108 are coupled with Vterm.

The MHL apparatus or system 1100 further includes a first coupling capacitor Cm 1132 with a first end coupled with rxcp 1102 and a second end coupled with a positive node DP; a second coupling capacitor Cm 1142 with a first end coupled with rxcn 1104 and a second end coupled with a negative node DN; and a third coupling capacitor Cm 1152 with a first end coupled with a common mode node between resistor 1110 and resistor 1112, and a second end coupled with a clock node CLK. The apparatus or system 1100 includes resistors Rm 1134 and 1135 between node DP and node DN. Node DP is further coupled with a first end of a capacitor Cp 1136, a second end of capacitor 1136 being coupled with ground. Node DN is further coupled with a first end of a Cp capacitor 1146, a second end of capacitor 1146 being coupled with ground. Node CLK is further coupled with a first end of a capacitor Cp 1156 and a first end of a resistor Rm 1154, a second end of capacitor 1156 and a second end of resistor 1154 being coupled with ground.

In some embodiments, the CLK node is coupled with a first input of an amplifier 1170, a second input of amplifier 1170 being coupled with ground. In some embodiments, an output of the amplifier 1170 is fed back in a DC coupled manner to the differential portion of the circuit, the output being coupled with a node between resistor Rm 1134 and resistor Rm 1135. Also illustrated is AC transfer function for the common mode signal, including an indication of the common mode signal frequency position.

In some embodiments, apparatus or system 1100 again utilizes a reverse AC current to reduce the charge in the DP and DN nodes, which operates to reduce the common mode voltage at DP and DN nodes. In some embodiments, the reduction in the common voltages at the DP and DN operates to reduce the effective common mode voltage swing.

In some embodiments, order to increase or maximize compensation operation, a threshold may be adjusted, such as via an I2C link. In some embodiments, a DPLL (digital phase lock loop) may be used to adapt the loop to find an optimized or adjusted threshold for different clock swing voltages and rise/fall times. In some embodiments, in a particular hardware implementation, an apparatus or system may reuse a channel-1 equalizer provide common clock swing compensation.

Figure 12:
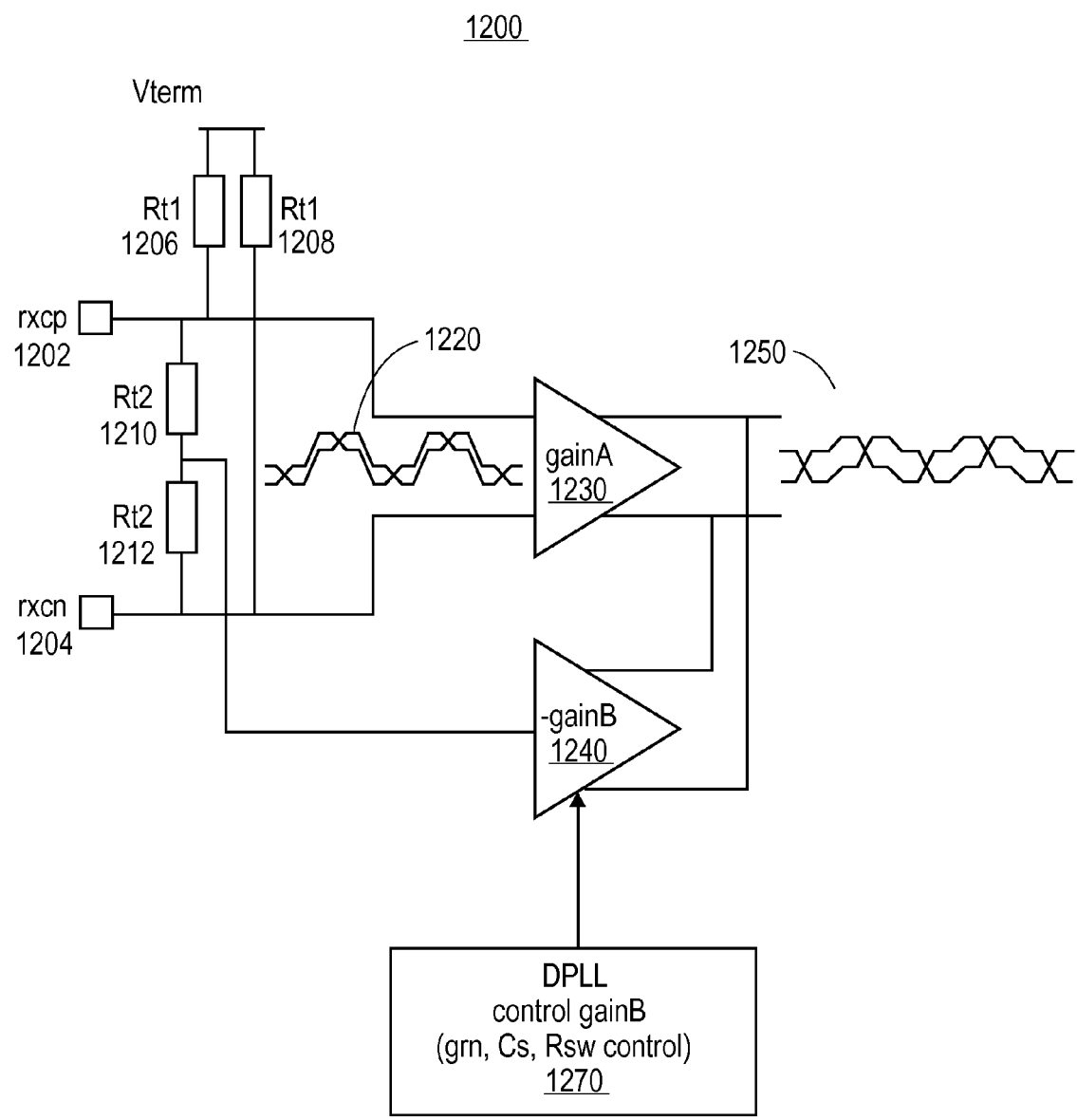
FIG. 12 is an illustration of an embodiment of an apparatus to reduce common mode voltage swing.

FIG. 12 is an illustration of an embodiment of an apparatus to reduce common mode voltage swing including threshold adjustment. In FIG. 12, an apparatus or system 1200 includes terminals rxcp 1202 and rxcn 1204, the nodes being linked by resistors Rt2 1210 and 1212, with terminal rxcp 1202 coupled with a first end of a resistor Rt1 1206 and terminal rxcn 1204 coupled with a first end of a resistor Rt1 1208, where a second end of each of resistors 1206 and 1208 is coupled with Vterm.

In this illustration, the apparatus or system 1200 includes a first amplifier element 1230, shown as having a game of gainA, coupled with rxcp and rxcn. In some embodiments, the apparatus 1200 further includes a second amplifier element 1240 with a negative gain of −gainB, the second amplifier element 1240 having an input at a node between resistor 1210 and resistor 1212 for sensing of the common signal and an output at output nodes of the first amplifier 1230.

In some embodiments, the second amplifier element 1240 senses the input common mode signal, and operates to amplify this signal with a reverse gain (−gainB) such that the total gain of common mode signal will be gainA−gainB. In some embodiments, amplifier 1240 receives a control input from DPLL 1270 to adapt the loop based on circuit conditions and values.

Figure 13:
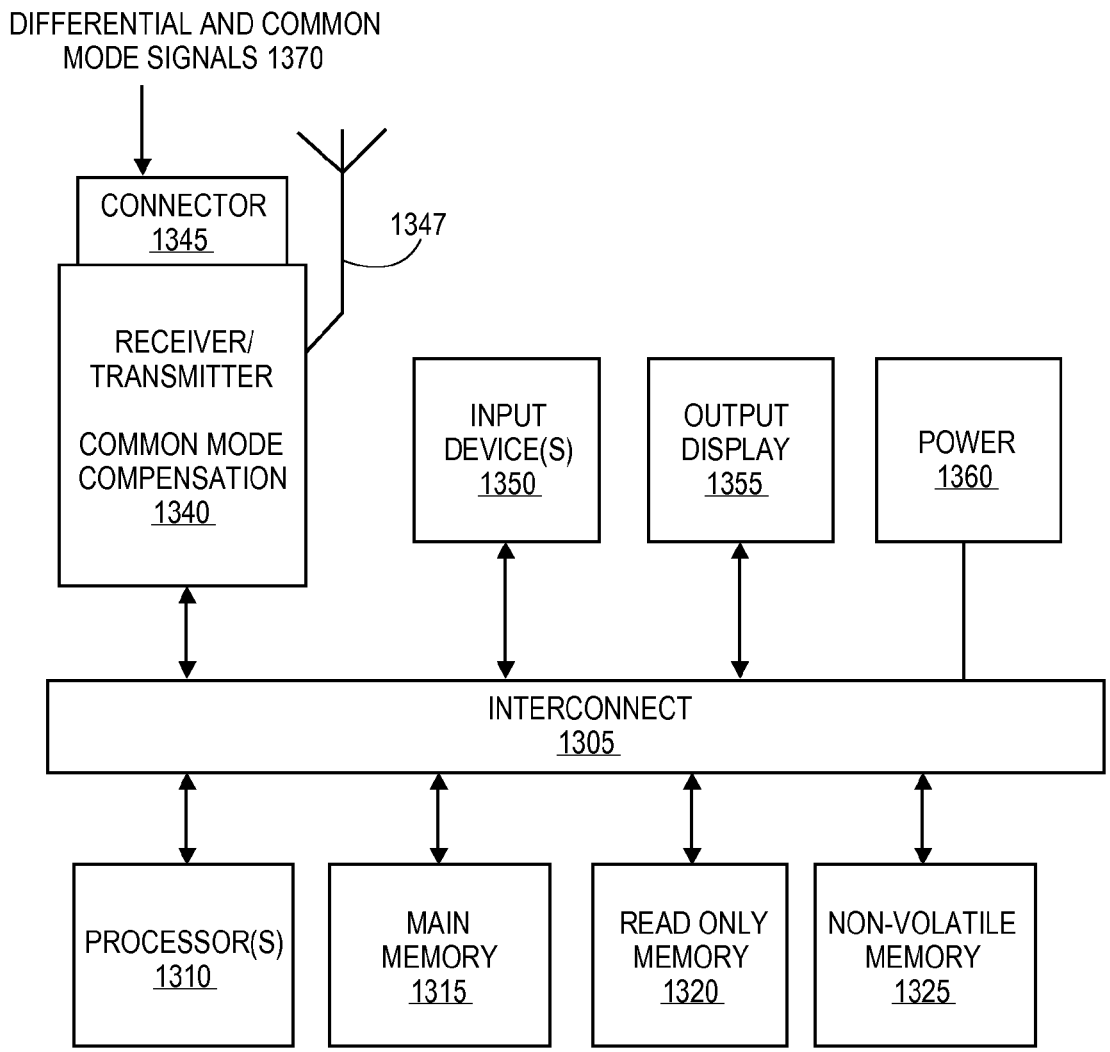
FIG. 13 illustrates an embodiment or system including common mode compensation.

FIG. 13 illustrates an embodiment or system including common mode compensation. The apparatus or system (referred to here generally as an apparatus) may include a common mode compensation circuit. In some embodiments, the protocol is MHL, with the system providing for processing of differential data signals modulated by a common mode clock signal. However, embodiments are not limited to any particular protocols. In this illustration, certain standard and well-known components that are not germane to the present description are not shown. In some embodiments, the apparatus 1300 may include a video sink device to receive audio-video data.

In some embodiments, the apparatus 1300 comprises an interconnect or crossbar 1305 or other communication means for transmission of data. The apparatus 1300 may include a processing means such as one or more processors 1310 coupled with the interconnect 1305 for processing information. The processors 1310 may comprise one or more physical processors and one or more logical processors. The interconnect 1305 is illustrated as a single interconnect for simplicity, but may represent multiple different interconnects or buses and the component connections to such interconnects may vary. The interconnect 1305 shown in FIG. 13 is an abstraction that represents any one or more separate physical buses, point-to-point connections, or both connected by appropriate bridges, adapters, or controllers.

In some embodiments, the apparatus 1300 further comprises a random access memory (RAM) or other dynamic storage device or element as a main memory 1315 for storing information and instructions to be executed by the processors 1310. In some embodiments, main memory may include active storage of applications including a browser application for using in network browsing activities by a user of the apparatus 1300. In some embodiments, memory of the apparatus may include certain registers or other special purpose memory.

The apparatus 1300 also may comprise a read only memory (ROM) 1320 or other static storage device for storing static information and instructions for the processors 1310. The apparatus 1300 may include one or more non-volatile memory elements 1325 for the storage of certain elements, including, for example, flash memory and a hard disk or solid-state drive.

One or more transmitters or receivers 1340 may also be coupled to the interconnect 1305. In some embodiments, the receivers or transmitters 1340 may be coupled to a connector 1345 for the reception of data, which may include combined differential and common mode signals 1370. For example, a conductor pair coupled to the connector 1345 may be utilized for the transfer of a differential signal modulated by a common mode signal. In some embodiments, the receiver/transmitter may include a common mode compensation circuit to compensate for excessive common mode voltage swing. In some embodiments, the common mode compensation circuit may be as illustrated in FIG. 2, 3, 6, or 11. The apparatus 1300 may further include one or more omnidirectional or directional antennas 1347 for the reception of data via radio signals.

The apparatus 1300 may also be coupled via the interconnect 1305 to an output display 1355. In some embodiments, the display 1355 may include a liquid crystal display (LCD) or any other display technology, for displaying information or content to a user. In some environments, the display 1355 may include a touch-screen that is also utilized as at least a part of an input device. In some environments, the display 1355 may be or may include an audio device, such as a speaker for providing audio information.

The apparatus 1300 may also comprise a power device or apparatus 1360, which may comprise a power supply, a battery, a solar cell, a fuel cell, or other system or device for providing or generating power. The power provided by the power device or system 1360 may be distributed as required to elements of the apparatus 1300.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a computer-readable non-transitory storage medium having stored thereon computer program instructions, which may be used to program a computer (or other electronic devices) to perform a process according to the present invention. The computer-readable storage medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

In some embodiments, an apparatus includes a connector for the transfer of the data, the connector including connections for a first set of one or more conductors; a receiver for the reception of data via the connector, the received data including a first signal and a second signal transmitted via the set of one or more conductors, the second signal being a common mode signal modulating the first signal, the receiver including an amplifier to amplify the received data with a positive gain; and a common mode compensation circuit to compensate for a voltage swing of the common mode signal in the amplified received data. The wherein the common mode compensation circuit is to sense the common mode signal, amplify the sensed common mode signal with a negative gain, and feed back the amplified common mode to output nodes of the receiver.

In some embodiments, the first signal of the apparatus is a differential data signal, and the second signal is a common mode clock signal.

In some embodiments, the set of one or more conductors of the apparatus is a pair of wires. In some embodiments, the first signal and second signal are signals compatible with the MHL (Mobile High-definition Link) protocol.

In some embodiments, the apparatus includes a first input node and a second input node, the first input node and second input node being coupled by a first resistance in series with a second resistance, the common mode compensation circuit including an input coupled with a node between the first resistance and the second resistance.

In some embodiments, the common mode compensation circuit is operable to reduce charge at the output nodes of the receiver to reduce common mode voltage.

In some embodiments, the common mode compensation circuit includes a threshold that is adjustable based on signal conditions.

In some embodiments, a method includes receiving a plurality of signals on a set of one or more conductors, the plurality of signals includes a first signal and a second signal, the second signal being a common mode signal modulating the first signal; amplifying the plurality of signals with a positive gain; sensing the common mode signal and amplifying the sensed common mode signal with a negative gain; and compensating for a voltage swing of common mode signal in the amplified plurality of signals by feeding back the amplified common mode signal to a set of output nodes for the plurality of signals.

In some embodiments, the first signal of the method is a differential data signal, and second signal is a common mode clock signal. In some embodiments, the first signal and second signal are signals compatible with the MHL (Mobile High-definition Link) protocol.

In some embodiments, compensating for the voltage swing of the common mode signal includes reducing charge at the output nodes to reduce common mode voltage.

In some embodiments, the common mode compensation circuit includes a threshold, the method further including adjusting the threshold based on signal conditions.

In some embodiments, an apparatus includes a first terminal for a first signal input and a second terminal for a second signal input; a first resistance and a second resistance, a first end of the first resistance being coupled with the first terminal and a first end of the second resistance being coupled with the second terminal, a second end of the first resistance and a second end of the second resistance being coupled together at a node; a first amplifier, a first input the first amplifier being coupled with the first terminal and a second input of the first amplifier being couple with the second terminal; and a second amplifier, an input to the second amplifier being coupled with the node between the first resistance and the second resistance, a first output of the second amplifier being coupled to a first output of the first amplifier and a second output of the second amplifier being coupled to a second output of the first amplifier. In some embodiments, the first amplifier has a positive gain factor and the second amplifier has a negative gain factor.

In some embodiments, the first terminal and second terminal are to receiver a differential signal and a common mode signal, the common mode signal being modulated on the differential signal. In some embodiments, the differential signal is a differential data signal and the common mode signal is a common mode clock signal. In some embodiments, the differential signal and the common mode signal are signals compatible with the MHL protocol.

In some embodiments, the second amplifier is operable to reduce charge at the outputs of the first amplifier to reduce common mode voltage.

In some embodiments, the apparatus further includes a circuit to provide a control signal to the second amplifier, circuit sensing the common mode signal and adapting the control signal to circuit conditions. In some embodiments, the circuit includes a digital phase lock loop (DPLL).

What is claimed is:
1. An apparatus comprising:
  a connector for the transfer of data, the connector including connections for a set of one or more conductors;
  a receiver for the reception of data via the connector, the received data including a first signal and a second signal transmitted via the set of one or more conductors, the second signal being a common mode signal modulating the first signal, the receiver including an amplifier to amplify the received data with a positive gain; and
  a common mode compensation circuit to compensate for a voltage swing of the common mode signal in the amplified received data;
  wherein the common mode compensation circuit is to sense the common mode signal, amplify the sensed common mode signal with a negative gain, and feed back the amplified common mode to output nodes of the receiver.
2. The apparatus of claim 1, wherein the first signal is a differential data signal.
3. The apparatus of claim 1, wherein the second signal is a common mode clock signal.
4. The apparatus of claim 1, wherein the set of one or more conductors is a pair of wires.
5. The apparatus of claim 1, wherein the first signal and second signal are signals compatible with the MHL™ (Mobile High-definition Link) protocol.
6. The apparatus of claim 1, wherein the apparatus includes a first input node and a second input node, the first input node and second input node being coupled by a first resistance in series with a second resistance, the common mode compensation circuit including an input coupled with a node between the first resistance and the second resistance.

7. The apparatus of claim 1, wherein the common mode compensation circuit is operable to reduce charge at the output nodes of the receiver to reduce common mode voltage.

8. The apparatus of claim 1, wherein the common mode compensation circuit includes a threshold that is adjustable based on signal conditions.

9. A method comprising:
receiving a plurality of signals on a set of one or more conductors, the plurality of signals includes a first signal and a second signal, the second signal being a common mode signal modulating the first signal;
amplifying the plurality of signals with a positive gain;
sensing the common mode signal and amplifying the sensed common mode signal with a negative gain; and
compensating for a voltage swing of common mode signal in the amplified plurality of signals by feeding back the amplified common mode signal to a set of output nodes for the plurality of signals.

10. The method of claim 9, wherein the first signal is a differential data signal.

11. The method of claim 9, wherein the second signal is a common mode clock signal.

12. The method of claim 9, wherein the first signal and second signal are signals compatible with the MHL™ (Mobile High-definition Link) protocol.

13. The method of claim 9, wherein compensating for the voltage swing of the common mode signal includes reducing charge at the output nodes to reduce common mode voltage.

14. The method of claim 9, wherein the common mode compensation circuit includes a threshold, and further comprising adjusting the threshold based on signal conditions.

* * * * *